(12) United States Patent
Shaw et al.

(10) Patent No.: US 10,729,046 B2
(45) Date of Patent: Jul. 28, 2020

(54) APPARATUS AND METHOD FOR UTILIZING COMMERCIAL OFF THE SHELF CIRCUIT BOARDS IN A HIGHLY KINEMATIC ENVIRONMENT

(71) Applicant: Crystal Group Inc., Hiawatha, IA (US)

(72) Inventors: James E Shaw, Ely, IA (US); Moji Hosseini, Iowa City, IA (US)

(73) Assignee: Crystal Group, Inc., Hiawatha, IA (US)

( * ) Notice: Subject to any disclaimer, the term of this patent is extended or adjusted under 35 U.S.C. 154(b) by 196 days.

(21) Appl. No.: 15/783,284

(22) Filed: Oct. 13, 2017

(65) Prior Publication Data

US 2018/0042149 A1 Feb. 8, 2018

Related U.S. Application Data

(62) Division of application No. 14/926,449, filed on Oct. 29, 2015, now Pat. No. 9,820,419.

(60) Provisional application No. 62/072,510, filed on Oct. 30, 2014.

(51) Int. Cl.
*H05K 7/14* (2006.01)
*H05K 13/00* (2006.01)

(52) U.S. Cl.
CPC ............. *H05K 13/00* (2013.01); *H05K 7/142* (2013.01); *H05K 7/1434* (2013.01)

(58) Field of Classification Search
CPC ....... H05K 13/00; H05K 7/142; H05K 7/1434
See application file for complete search history.

(56) References Cited

U.S. PATENT DOCUMENTS

| | | | |
|---|---|---|---|
| 1,489,325 A | 4/1924 | Kraft | |
| 3,431,811 A | 3/1969 | Yonkers | |
| 5,065,489 A | 11/1991 | Mullen et al. | |
| 5,902,084 A | 5/1999 | Garcia | |
| 5,975,821 A | 11/1999 | Kue | |
| 6,158,266 A | 12/2000 | Elipe et al. | |
| 6,473,309 B1 | 10/2002 | Parson | |
| 8,672,596 B2 | 3/2014 | Condliff et al. | |
| 9,243,657 B2 | 1/2016 | McCorkell | |
| 2007/0292231 A1 | 12/2007 | Boot | |
| 2014/0328644 A1 | 11/2014 | McCorkell | |

OTHER PUBLICATIONS

Richo, "2002 New Products", http://www.nitron-components.com/pdf/marques/RICHCO%20ESSENTRA/CATALOGUE.pdf (Year: 2002).*
Wikipedia, "Thread-locking fluid", Jun. 22, 2014, https://en.wikipedia.org/w/index.php?title=Thread-locking_fluid&oldid=613959991 (Year: 2014).*
SparkFun, "Foam PCB Tape—3M VHB Acrylic 1" (1 yard), Apr. 4, 2014, https://www.sparkfun.com/products/retired/12752 (Year: 2014).*

\* cited by examiner

*Primary Examiner* — Livius R. Cazan
(74) *Attorney, Agent, or Firm* — Simmons Perrine Moyer Bergman PLC (57) ABSTRACT

A system is disclosed which utilizes a stabilization disk 30 or rigid cup containing adhesive which is bonded to an underside of a circuit board and then bolted to a chassis of a piece of military electronic equipment, so as to create a mounting location between the circuit board and the chassis where the circuit board is lacking a regular fastener receiving mounting hole therethrough.

9 Claims, 7 Drawing Sheets

APPARATUS AND METHOD FOR UTILIZING COMMERCIAL OFF THE SHELF CIRCUIT BOARDS IN A HIGHLY KINEMATIC ENVIRONMENT

CROSS REFERENCE TO RELATED APPLICATIONS

This application is a divisional application of the non-provisional patent application having the Ser. No. 14/926,449 filed Oct. 29, 2015, which application claims the benefit of the filing date of the provisional patent application having Ser. No. 62/072,510 filed Oct. 30, 2014, the contents of which are incorporated herein in their entirety by this reference.

FIELD OF THE INVENTION

The present invention generally relates to ruggedized electronics and more particularly relates to methods and apparatuses for mounting circuit boards in highly kinematic environments, and, even more particularly, relates to mounting circuit boards at locations on the circuit board where a mounting location or tie point was not fabricated by the circuit board manufacturer.

BACKGROUND OF THE INVENTION

In the past, commercial off the shelf (COTS) circuit boards are made for a variety of uses to fit within predetermined envelope requirements and they are often done in cost effective ways.

While these circuit boards may have many technology and cost advantages in particular applications, especially highly kinematic environments with severe shock and vibration, they also have some drawbacks. They often are made in a manner to increase the ease of electronic circuitry layout at the cost of providing ample and desired mounting points for such demanding applications.

Consequently, there exists a need for improved apparatuses for and methods for providing mounting points for COTS circuit boards at mounting locations without the COTS circuit board manufacturer having made a mounting point at such mounting location.

SUMMARY OF THE INVENTION

It is an object of the present invention to provide cost effective circuit boards which have versatile mounting locations and methods for enhanced shock and vibration applications.

It is a feature of the present invention to utilize a stabilization disk disposed at and around a mounting location which lacks a manufacturer provided mounting point.

It is an advantage of the present invention to provide the ability of electronics manufacturers to utilize more COTS circuit boards in highly kinematic environments, despite the fact they may lack a mounting point which would normally provide for a desired mounting location.

It is another object of the present invention to provide for a new method of laying out COTS circuit boards without providing a "real estate hungry" mounting point at every location that an OEM might desire to be used as a mounting location.

It is another feature of the invention to create a COTS circuit board with a plurality of virtual mounting points which are spaced apart from each other so as to permit the necessary space between stabilization disks to be located on the underside of the circuit card.

It is another feature of the present invention to utilize a replacement ILM plate on the back side of the COTS circuit board which itself provides a COTS circuit board to computer chassis tie point or mounting location.

The present invention is an apparatus and method for efficiently and cost effectively providing a mounting point at locations on circuit boards which were not manufactured with a hole through the circuit card for mounting at such locations, the method and apparatus is designed to satisfy the needs mentioned above, provide the previously stated objects, include the above-listed features, and achieve the advantages explained above. The present invention is carried out in a "real estate wasted-less" manner, in a sense that no excess mounting holes are created through the circuit card.

Accordingly, one embodiment of the present invention is directed to a method of providing a circuit board mounting location at a point about a location on the circuit board which does not have a fastener receiving hole therethrough, the method comprising the steps of: providing an adhesive receiving structure configured to retain adhesive therein; coupling said adhesive receiving structure to a circuit board at a location where no fastener receiving hole is located through said circuit board; and coupling said adhesive receiving structure to a chassis and thereby coupling said circuit board to said chassis.

Additionally, the present invention is an interface medium (shape is not important) which is electrically non-conductive and further has a method of attachment to a structure using common fastener hardware and a non-conductive bonding medium creating an attachment point where needed.

BRIEF DESCRIPTION OF THE DRAWINGS

The invention may be more fully understood by reading the foregoing description of the preferred embodiments of the invention, in conjunction with the appended drawing wherein.

DETAILED DESCRIPTION

Although described with particular reference to OEM and COTS circuit boards in highly kinematic environments where the benefits of the present invention may be particularly valuable, the present invention is intended to apply to all types of circuit boards in all types of environments.

Figure 1:
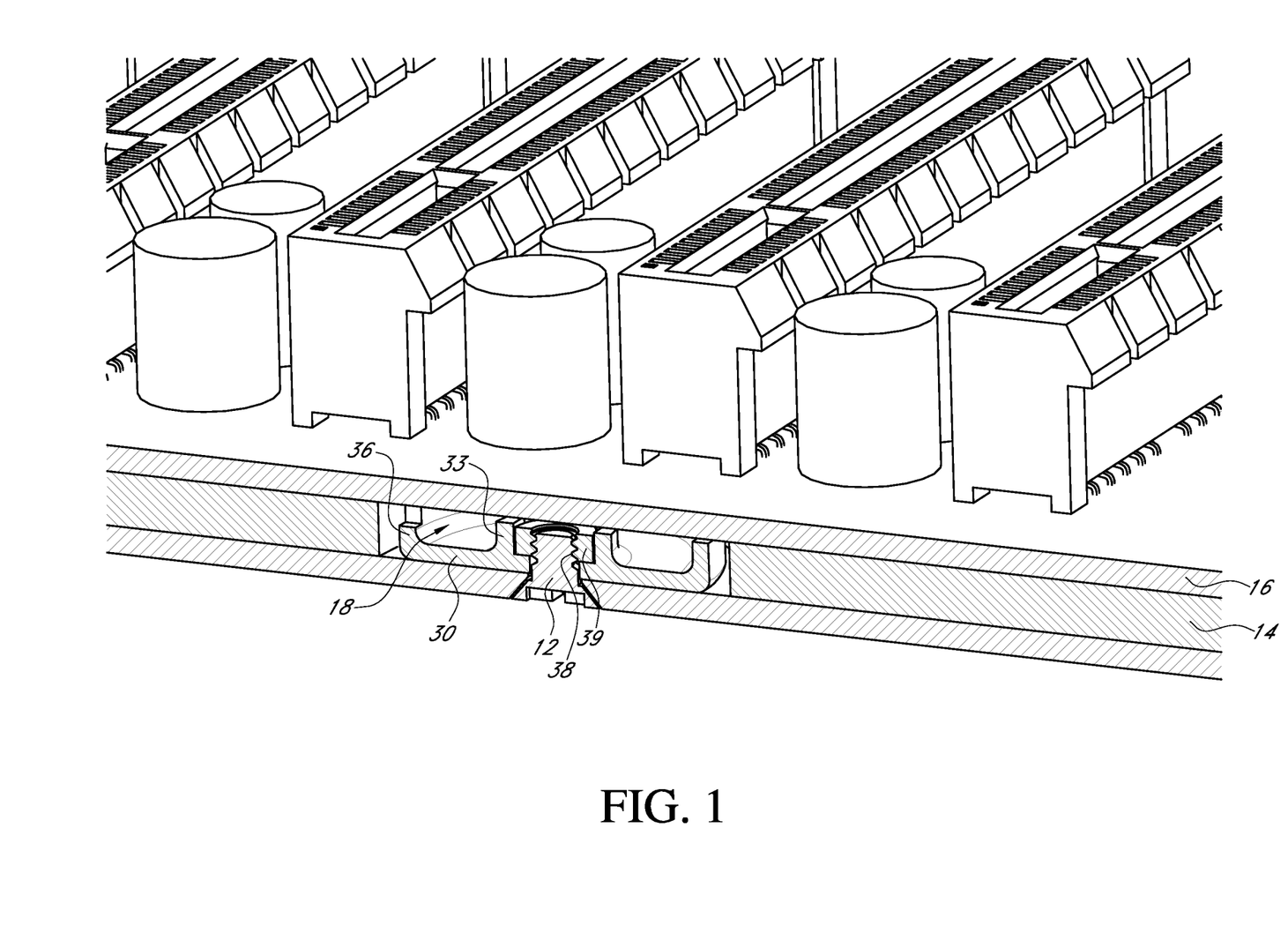
FIG. 1 is a cross-sectional view of the stabilization disk of FIG. 3 shown in a representative environment under a circuit board.
Figure 3:
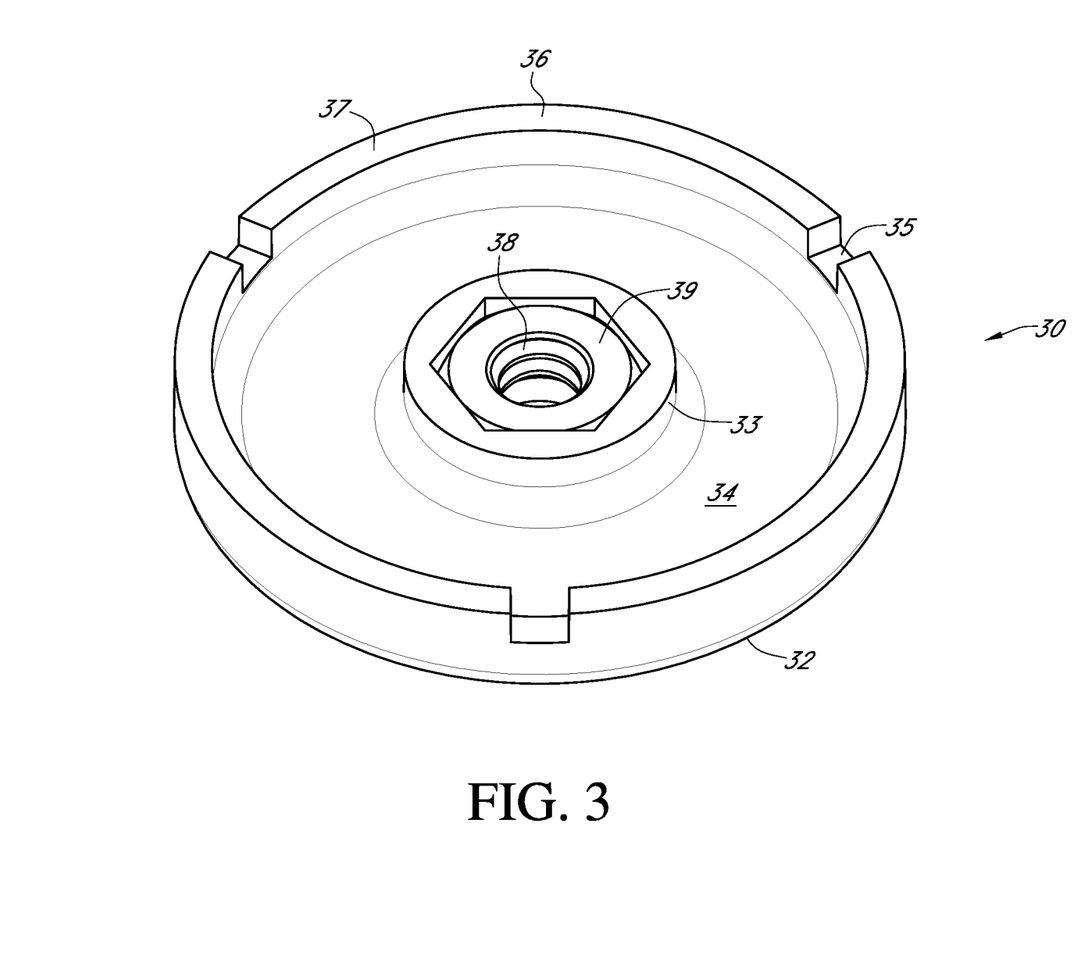
FIG. 3 is perspective view of the stabilization disk of the present invention.

Now referring to the Figures, where like numerals refer to like structure and matter throughout, and more particularly to FIG. 1, there is shown a cross-sectional view of the stabilization disk 30 of the present invention and of FIG. 3 in combination with a chassis mounting plate 14 of a chassis of a piece of electronic equipment, and a COTS circuit board 16, having front side or top side with electronic components mounted thereon. Stabilization disk 30 may function as a means for containing adhesive and may function as a means for coupling to a back side of a circuit board and may be any suitable shape, it may be made of many different types of rigid or semi-rigid material which is strong, adheres well to an adhesive, can be tapped, machine or cast to make threads therein or any subset of such properties or any suitable substitute including but not limited to plastics, Kevlar, natural and synthetic dielectrics or the like. A fastener means or fastener 12 is shown as a bolt but other suitable substitutes could be used as well. Fastener 12 may be made of material similar to the material suitable for stabilization disk 30, as well as conductive materials such as metals. A hole is made through the chassis mounting plate 14 to receive the fastener 12. Fastener 12 mates with fastener mating threads 38 of nut 39 (FIG. 3). It should be understood that any member separate form or integrated with the stabilization disk 30 that has the ability to advance a threaded rod when relative rotation movement therebetween occurs could be substituted for the threaded nut. Adhesive/dielectric 18 is shown disposed between stabilization disk central fastener penetrating portion 33 and stabilization disk perimeter wall 36 and in contact with a bottom surface of circuit board 16. The adhesive/dielectric 18 holds the circuit board 16 to the stabilization disk 30, which is held to the chassis mounting plate 14 by fastener 12 mating with fastener mating threads 38, thereby creating a mounting location for the circuit board 16 to the chassis mounting plate 14.

Figure 2:
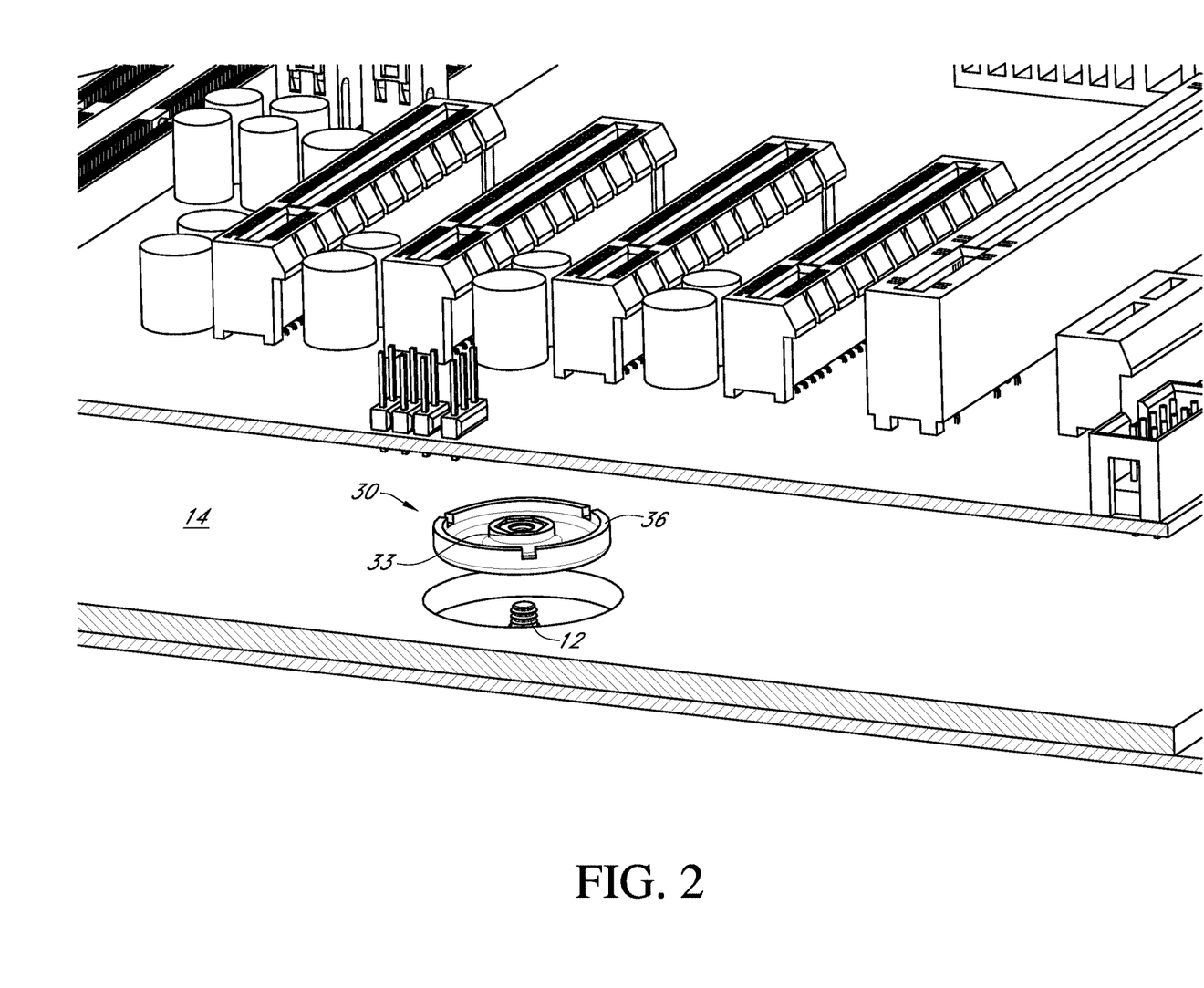
FIG. 2 is an exploded perspective view of the stabilization disk of FIG. 3 shown in a representative environment.

Now referring to FIG. 2, there is shown an exploded perspective via the items shown in FIG. 1.

Now referring to FIG. 3, there is shown a close up view of the stabilization disk 30 of the present invention. Stabilization disk 30 has a stabilization disk bottom 32 which, in some embodiments of the invention utilized in particular applications, may be placed adjacent to chassis mounting plate 14, with or without additional intervening material, such as an adhesive or shock absorbing material. The combination of stabilization disk perimeter wall 36 and said stabilization disk bottom 32; and stabilization disk central fastener penetrating portion 33 forms a means for containing adhesive or a stabilization disk adhesive cup portion 34 for receiving therein an adhesive means such as a strong dielectric adhesive, such as a two component flexible polyurethane adhesive, such as Araldite 2040, available from Huntsman Advanced Materials of Basel Switzerland, or 3M Araldite 2040. Stabilization disk central fastener penetrating portion 33 is shown having a void therein for receiving nut 39, which has fastener mating threads 38. However, it should be understood that the fastener mating threads 38 could be formed into the dielectric material which is used to make stabilization disk 30. Similarly, fastener mating threads 38 could be omitted if a different type of fastener were used instead of fastener 12. Stabilization disk perimeter wall top side 37 should be made to be located so that when stabilization disk bottom 32 touches chassis mounting plate 14, there remains a small gap between stabilization disk perimeter wall top side 37 and a bottom side of circuit board 16 to allow adhesive to form a bond between stabilization disk 30 and circuit board 16. Adhesive exit void 35 may be provided to allow excess adhesive to exit the cavity formed between stabilization disk bottom 32 and circuit board 16. An alternate description and/or embodiment of the stabilization disk could be a rectangular shaped "disk" or a regular or irregularly shaped stabilization rib comprising: a rectangular or irregularly shaped stiffener bottom; a rib perimeter wall or walls; a rib with one or more fastening locations distributed along rib; a rib adhesive track or groove; and where said stabilization rib is configured with a stabilization rib perimeter wall top side 37 so that said stabilization rib perimeter wall top side 37 can be adhesively bound to an underside of a circuit board 16 when said stabilization rib central fastener penetrating portion 33 is mechanically coupled to a chassis mounting plate 14. Means for containing adhesive should be made of a durable, strong, dielectric material which is suitable for mechanically transferring forces between a circuit board 16 and a chassis mounting plate 14 when used in a high kinematic environment, such as military equipment. In another embodiment of the present invention, the stabilization disk 30 would be custom made into an irregular shape so as to accommodate circuit boards with components on both sides. The height or thickness of the side walls of the altered stabilization disk 30 could also be made to be sufficient to span over the top of electronic components mounted on the same side as the stabilization disk 30. An internal wall inside of the external wall of the stabilization disk 30 could be custom made as well to create an adhesive free zone within the stabilization disk 30 where electronic components would be separated from all adhesives.

In operation, one embodiment of the system and method of the present invention may function as follows: a stabilization disk 30 is bonded with an adhesive to an underside of circuit board 16 and stabilization disk 30 is bolted or screwed to chassis mounting plate 14 using known mounting techniques. This is accomplished without the need for a hole through the circuit board 16 to receive therethrough a fastener.

Figure 4:
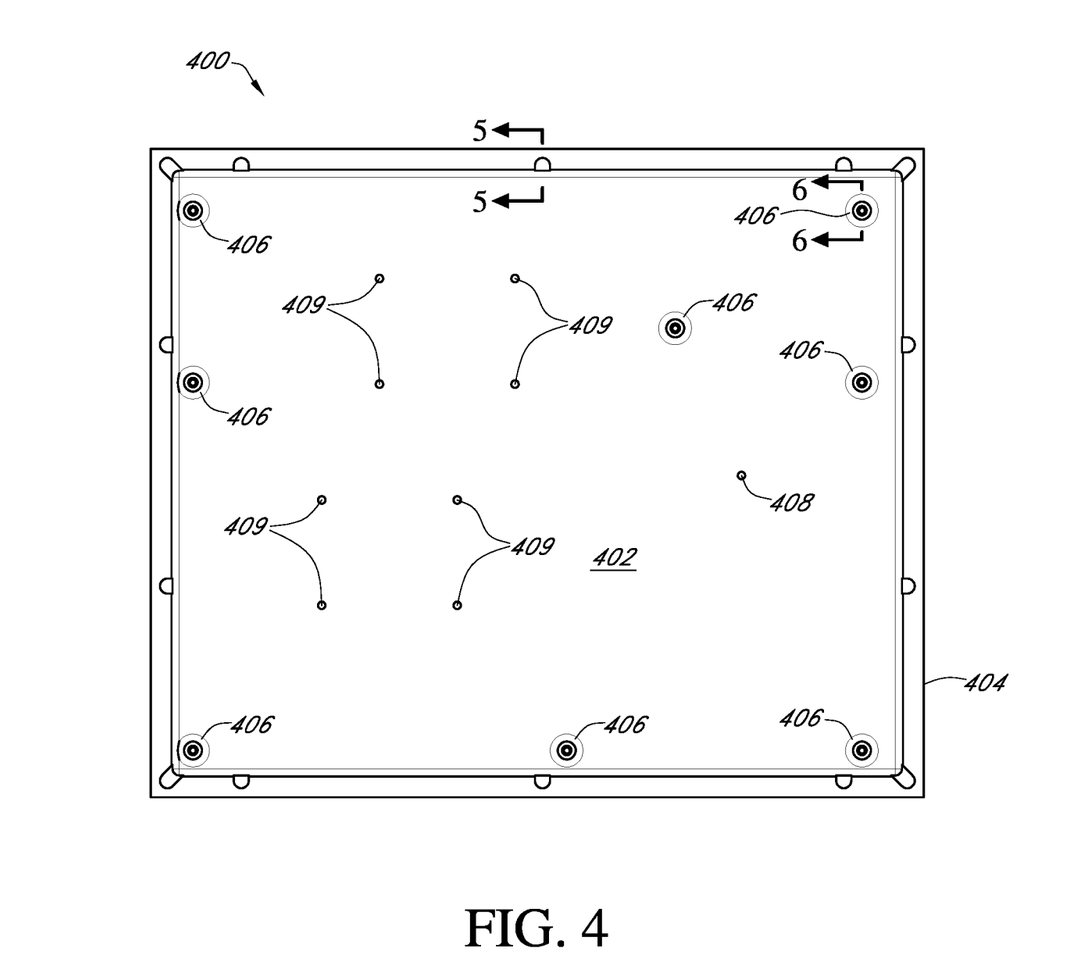
FIG. 4 is a plan view of a molding fixture used in the method of the present invention.
Figure 5:
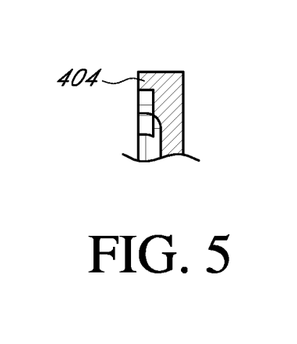
FIG. 5 is a cross-sectional view taken on line B-B of FIG. 4.
Figure 6:
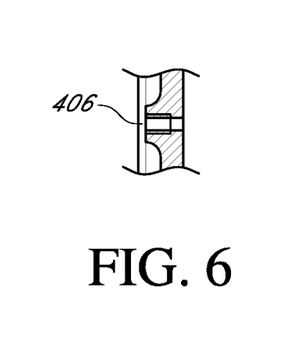
FIG. 6 is a cross-sectional view taken on line A-A of FIG. 4.
Figure 7:
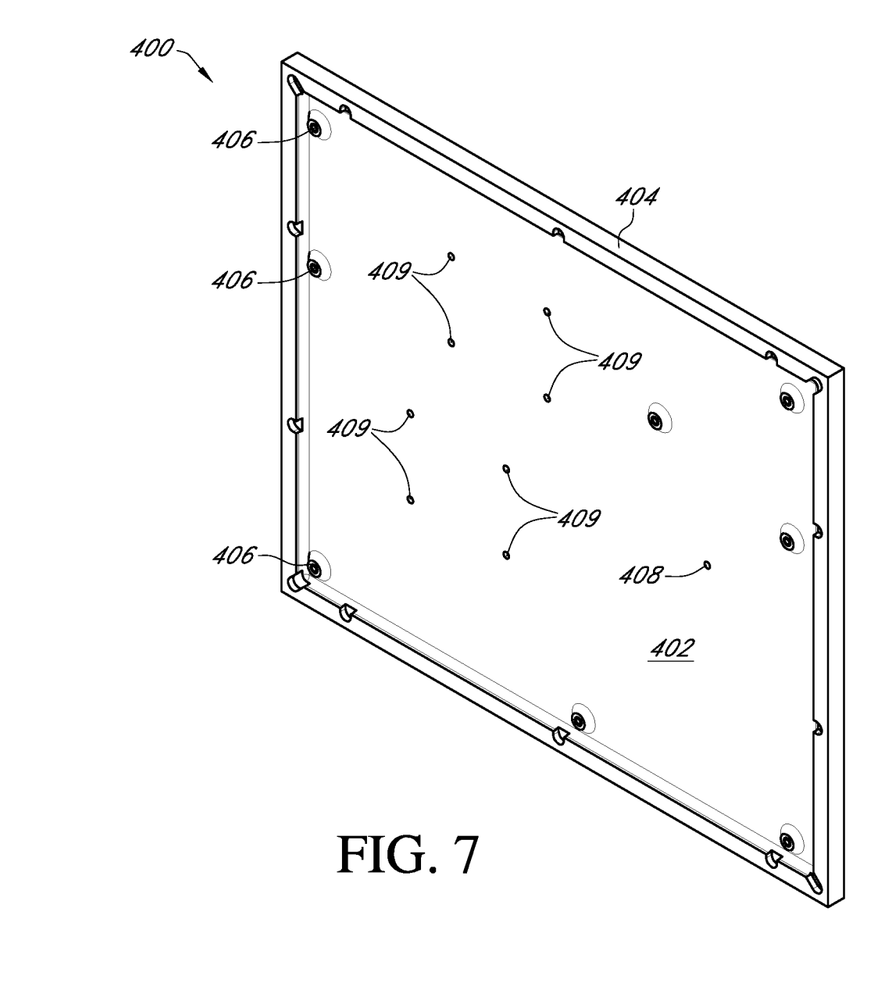
FIG. 7 is a perspective view of the molding fixture of FIG. 4.

Now referring to FIG. 4, there is shown a motherboard backside molding fixture, generally designated 400, of the method of the present invention. Motherboard backside molding fixture 400 is made of a motherboard backside molding fixture container bottom 402 with a motherboard backside molding fixture container side walls 404. The entire mold can be made from a single piece of machined or cast aluminum or multiple pieces or made from other materials or using other processes which are suitable for the particular application. (In some applications, it is conceivable that the motherboard backside molding fixture 400 might be designed to be left attached to the COTS circuit board 16 and could be made of material similar to stabilization disk 30.) Around the motherboard backside molding fixture container side walls 404, there are motherboard OEM anchor locations 406, which are raised protuberances, with volcano like shapes with holes therein and extending through the motherboard backside molding fixture container bottom 402, which are in registration with OEM anchor locations designed and fabricated into the COTS circuit board 16. In a central location, generally a distance away from any of the motherboard OEM anchor locations 406, is a motherboard aftermarket anchor location 408, which may be merely an un-tapped or a tapped hole through the motherboard backside molding fixture container bottom 402, which is configured to receive a fastener 12 from the chassis mounting plate 14, to which the modified COTS motherboard is anchored, via the stabilization disk 30. Also shown are two rectangular arrays of Chassis base plate holes 409, which may be tapped or untapped.

Figure 8:
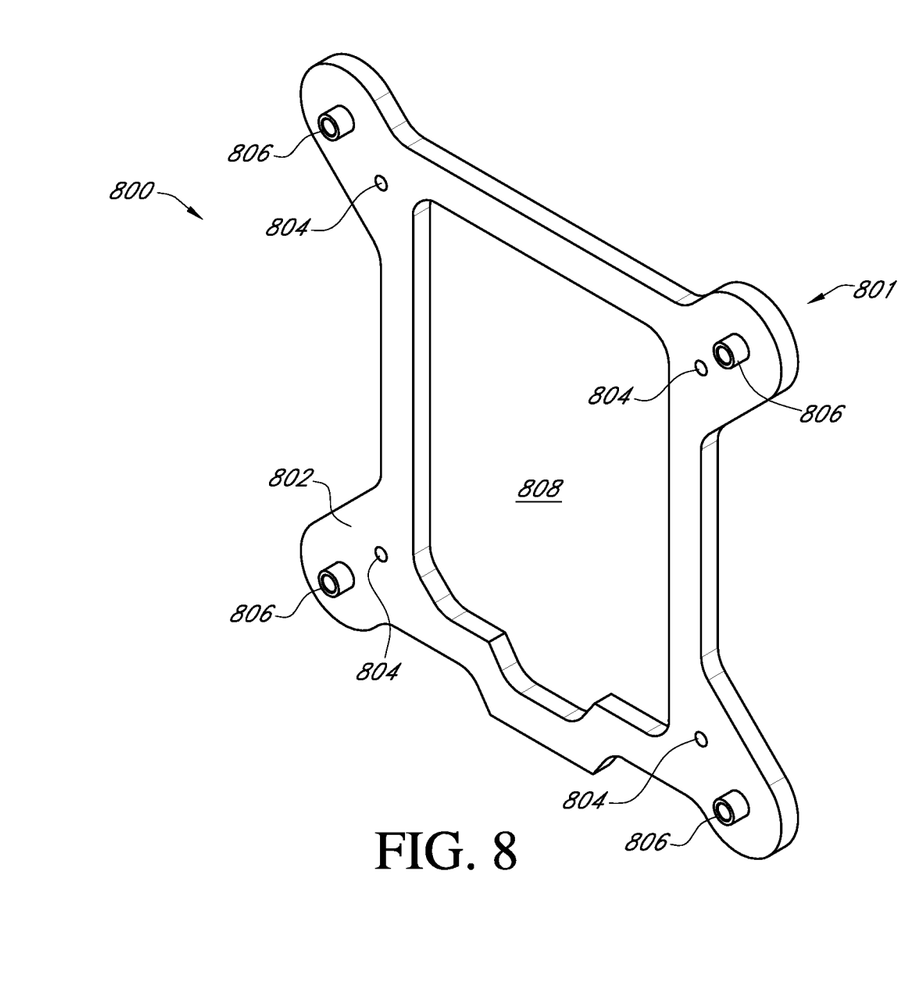
FIG. 8 is a perspective view of a replacement ILM back plate of the present invention.

Now referring to FIG. 8, there is shown an ILM back plate 800 of the present invention. This is designed to replace an OEM ILM back plate and the ILM back plate 800 may be thicker than the OEM ILM back plate and it will have an ILM back plate motherboard side 802 and an ILM back plate distal side 801. Chassis base plate to ILM back plate binding tapped screw receiving holes 804 are configured with internal threads to receive a fastener 12 through a chassis mounting plate 14 into the ILM back plate distal side 801 and toward the ILM back plate motherboard side 802. The Chassis base plate to ILM back plate binding tapped screw receiving holes 804 are in registration with the Chassis base plate holes 409, which can be tapped or untapped. ILM back plate motherboard penetrating screw receiving holes 806 are shown on the ILM back plate motherboard side 802 in a manner which is similar to prior art OEM ILM back plates. ILM back plate 800 may be made of machined or cast aluminum or other suitable materials using the same or other suitable manufacturing techniques.

Another embodiment of the present invention is best understood by referring to FIGS. 1-8. In this embodiment, the stabilization disk 30 is not merely adhered to the back of the COTS circuit board 16 by internal to the stabilization disk 30 adhesive. Instead, the improved COTS circuit board 16 is made by the following innovative method comprising the steps of:

1. Providing a motherboard backside molding fixture 400 which is sprayed with a silicon mold release.

2. Providing a stabilization disk 30, or a variation of it, (possibly without the stabilization disk perimeter wall 36) which is first attached to a motherboard backside molding fixture 400 at a motherboard aftermarket anchor location 408 by inserting a fastener 12 through the motherboard aftermarket anchor location 408, placing a nut 39 in the stabilization disk 30 and tightening the fastener 12 to the nut 39, thereby holding the stabilization disk 30 to the motherboard backside molding fixture container bottom 402.

3. Removing an ILM on the COTS circuit board 16 and its associated OEM back plate is also removed and the ILM back plate 800 is aligned with the motherboard backside molding fixture container bottom 402 so that the Chassis base plate holes 409 and Chassis base plate to ILM back plate binding tapped screw receiving holes 804 are aligned. A fastener 12 is inserted through Chassis base plate holes 409 and engages the Chassis base plate to ILM back plate binding tapped screw receiving holes 804.

4. Pouring a non-conductive adhesive such as epoxy with suitable mechanical properties in the void defined by motherboard backside molding fixture container bottom 402, motherboard backside molding fixture container side walls 404 and the outside of ILM back plate 800. The void inside of ILM back plate 800 is preferably left unfilled, but in some applications it may be desirable to fill intra-ILM back plate central void 808 with adhesive as well.

5. Placing the COTS circuit board 16 on the motherboard backside molding fixture 400 so that the motherboard OEM anchor locations 406 are aligned with the pre-existing anchor locations thereon, and the ILM back plate motherboard penetrating screw receiving holes 806 are aligned with the pre-existing holes that held the OEM ILM back plate. The adhesive contacts the back side of COTS circuit board 16 when it is secured to the epoxy filled motherboard backside molding fixture 400.

6. The epoxy is allowed to cure and then the screws extending through Chassis base plate holes 409 and Chassis base plate to ILM back plate binding screw receiving holes 804 are removed, the screws extending between COTS circuit board 16 and motherboard OEM anchor locations 406 are removed, as well as the screw extending into the nut 39.

7. Removing the modified COTS circuit board 16 from the motherboard backside molding fixture 400 and it is ready to be installed in a chassis mounting plate 14 through the OEM attachment locations which were previously in alignment with motherboard OEM anchor locations 406 and through all new attachment locations into the nut 39 and the Chassis base plate to ILM back plate binding tapped screw receiving holes 804.

Figure 9:
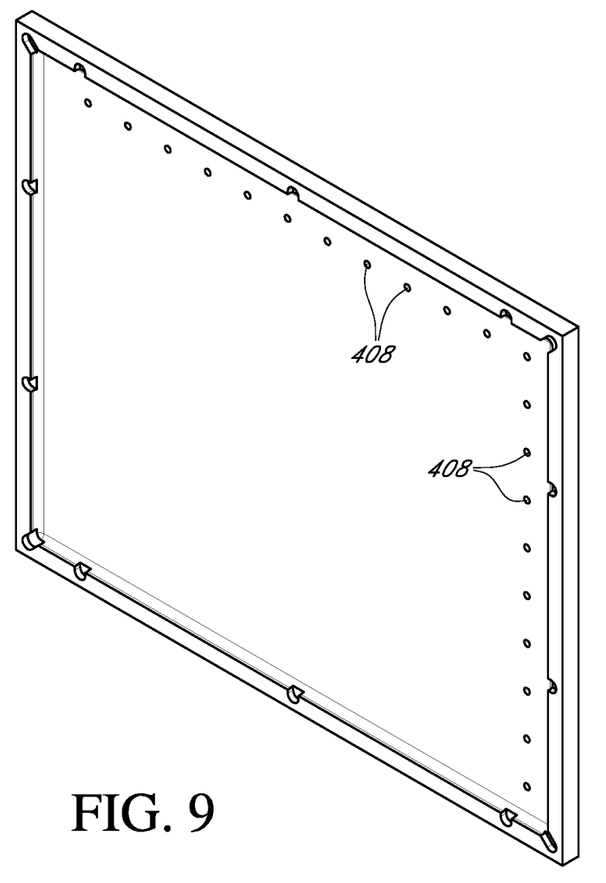
FIG. 9 is a perspective view of an alternate embodiment of the present invention.

Now referring to FIG. 9, there is shown an alternate embodiment of the present invention, which is very similar to that shown in FIGS. 4-7, except that instead of numerous motherboard OEM anchor locations 406, there are none. Also, instead of just one motherboard aftermarket anchor location 408, there are many. There is shown a representative top row of motherboard aftermarket anchor locations 408 and a representative right side column of motherboard aftermarket anchor locations 408. It should be understood that a full array or grid of motherboard aftermarket anchor locations 408 could be spread across the entire motherboard backside molding fixture container bottom 402. In this situation, the COTS circuit board could be designed without any OEM anchor locations. This provides for much flexibility in the placement of the virtual or aftermarket anchor locations that are created by the system and method of the present invention. In this arrangement, the COTS circuit board 16 would have the entire backside covered with epoxy and at every motherboard aftermarket anchor locations 408 there would be a stabilization disk 30 (or a suitable substitute) embedded in the epoxy. The user of the COTS circuit board 16 could decide to use any one or all of the stabilization disks 30. The spacing of motherboard aftermarket anchor locations 408 in the grid is dictated in part by the dimension of stabilization disk 30. With this embodiment of the present invention, a replacement for the ILM back plate 800 could optionally be made for each COTS circuit board 16 so that the Chassis base plate to ILM back plate binding screw receiving holes 804 are in alignment with the motherboard aftermarket anchor locations 408, i.e. with the holes through the motherboard backside molding fixture container bottom 402 so that screws can be used during the molding process to hold the ILM back plate 800 (adapted). Variations of this approach could result in a method for attaching circuit boards to a particular chassis which would include creating a standard array of virtual mounting locations patterned in a predetermined way which is independent of features on the opposite side of the circuit board thereby making the attachment, of a one sided motherboard of a predetermine dimension, to the chassis substantially universal regardless of the manufacturer or the placement of said mounting features fabricated at the time of circuit board fabrication of such motherboards.

The precise implementation of the present invention will vary depending upon the particular application. The means of containing adhesive may be circular, rectangular or irregularly shaped and may have a planar stabilization disk bottom or an irregularly configured stabilization disk bottom. The stabilization disk perimeter wall top side 37 may be flat or may contain a groove which may contain an adhesive or may comprise a protuberance on a flat or grooved surface.

The term motherboard is used herein to refer to a circuit board which contains a central processing unit (CPU), however many of the benefits of the present invention would be present in a non-motherboard circuit board. It is intended that the present invention, in some embodiments, would apply to a non-motherboard circuit board. The description herein has mentioned that the circuit board has a top or front side with electronic components thereon. It should be understood that certain embodiments of the present invention may be utilized on a circuit board with electronic components on both sides or with no electronic components on either side.

It is thought that the method and apparatus of the present invention will be understood from the foregoing description and that it will be apparent that various changes may be made in the form, construct steps and arrangement of the parts and steps thereof without departing from the spirit and scope of the invention or sacrificing all of their material advantages. The form herein described is merely a preferred exemplary embodiment thereof.

We claim:

1. A method of providing a circuit board mounting location at a point about a location on the circuit board which does not have a fastener receiving hole therethrough, the method comprising the steps of:
    providing a circuit board having a front side, a back side, and a perimeter edge;
    providing a fastener receiving structure;
    coupling the fastener receiving structure to only one of the front side or the back side of the circuit board at a location displaced from all portions of said perimeter edge and where no fastener receiving hole is located through the circuit board;
    coupling the fastener receiving structure to a chassis and thereby coupling the circuit board to the chassis at the location where no fastener receiving hole is located through the circuit board;
    said circuit board is a commercial-off-the-shelf (COTS) circuit board; and said step of providing a fastener receiving structure comprises providing an adhesive receiving structure which is configured to retain adhesive.

2. The method of claim 1 wherein the step of coupling the fastener receiving structure to a chassis comprises inserting a threaded shaft through a portion of the chassis and twisting the threaded shaft and thereby increasing forces existing between the circuit board and the chassis.

3. A method of claim 1 further comprising the steps of:
    using an adhesive to perform the step of coupling the fastener receiving structure to the circuit board.

4. A method for mounting a circuit board to a chassis comprising the steps of:
    providing a circuit board having a first side, a parallel second side, and a perimeter edge;
    providing a chassis;
    providing a means for containing adhesive;
    disposing an adhesive on a portion of said means for containing adhesive;
    disposing said means for containing adhesive to said first side or said parallel second side, and displaced form all portions of said perimeter edge; and
    mechanically coupling said means for containing adhesive to said chassis.

5. The method of claim 4 wherein said means for containing adhesive is a circular puck shaped cup.

6. The method of claim 4 further comprising the steps of providing a bolt and a nut.

7. The method of claim 4 wherein said means for containing adhesive comprises a perimeter wall.

8. The method of claim 7 wherein said perimeter wall comprises a perimeter wall top side.

9. The method of claim 8 wherein said perimeter wall top side is flat without a groove therein and without any protuberance thereon.

\* \* \* \* \*